(12) United States Patent
Fan (10) Patent No.: US 11,757,038 B2
(45) Date of Patent: Sep. 12, 2023

(54) SEMICONDUCTOR MEMORY STRUCTURE HAVING DRAIN STRESSOR, SOURCE STRESSOR AND BURIED GATE

(71) Applicant: NANYA TECHNOLOGY CORPORATION, New Taipei (TW)

(72) Inventor: Cheng-Hsiang Fan, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 43 days.

(21) Appl. No.: 17/497,687

(22) Filed: Oct. 8, 2021

(65) Prior Publication Data

US 2022/0029019 A1 Jan. 27, 2022

Related U.S. Application Data

(62) Division of application No. 16/520,569, filed on Jul. 24, 2019.

(51) Int. Cl.
*H01L 29/78* (2006.01)
*H01L 29/66* (2006.01)
*H01L 21/762* (2006.01)
*H01L 21/02* (2006.01)
*G11C 5/06* (2006.01)

(52) U.S. Cl.
CPC .......... *H01L 29/7848* (2013.01); *G11C 5/063* (2013.01); *H01L 21/02381* (2013.01); *H01L 21/76224* (2013.01); *H01L 29/66522* (2013.01)

(58) Field of Classification Search
CPC combination set(s) only.
See application file for complete search history.

(56) References Cited

U.S. PATENT DOCUMENTS

| 9,601,619 | B2* | 3/2017 | Sung | H01L 21/02532 |
|---|---|---|---|---|
| 10,043,854 | B1* | 8/2018 | Shin | G06F 12/0875 |
| 2012/0112271 | A1* | 5/2012 | Manabe | H01L 27/10876 257/330 |
| 2015/0255607 | A1* | 9/2015 | Lim | H01L 29/7834 257/192 |
| 2016/0211371 | A1* | 7/2016 | Tsai | H01L 29/7851 |

* cited by examiner

*Primary Examiner* — Suberr L Chi
(74) *Attorney, Agent, or Firm* — Xuan Zhang (57) ABSTRACT

The present disclosure provides a semiconductor memory structure. The semiconductor memory structure includes a substrate, a gate structure, a drain stressor and a source stressor. The gate structure is disposed in the substrate. Each of the source stressor and the drain stressor includes a strained part disposed in the substrate.

8 Claims, 9 Drawing Sheets

SEMICONDUCTOR MEMORY STRUCTURE HAVING DRAIN STRESSOR, SOURCE STRESSOR AND BURIED GATE

CROSS-REFERENCE TO RELATED APPLICATION

This application is a divisional application of U.S. Non-Provisional application Ser. No. 16/520,569 filed Jul. 24, 2019, which is incorporated herein by reference in its entirety.

TECHNICAL FIELD

The present disclosure relates to a semiconductor memory structure and a method for manufacturing the same, and more particularly, to a semiconductor memory structure with a drain stressor, a source stressor and a buried gate and a method for manufacturing the same.

DISCUSSION OF THE BACKGROUND

Reducing the size of semiconductor devices results in improved performance, increased capacity, and/or reduced cost. As semiconductor devices become smaller in size, however, a semiconductor device may not be able to realize diverse device characteristics. Therefore, size reduction requires more sophisticated techniques for semiconductor device manufacturing. For example, when scaling the channel length of a metal-oxide-semiconductor field-effect transistor (MOSFET) to a certain extent, short channel effect might occur. A MOSFET device is considered to be short when the channel length is of the same order of magnitude as the depletion-layer widths of the source and drain junction. Short channel effects include, for example, drain-induced barrier lowering and hot carrier degradation.

Moreover, to enhance the performance of the semiconductor devices, strained silicon has been used. Strained silicon is a layer of silicon in which the silicon atoms are stretched beyond their normal interatomic distance. Moving these silicon atoms farther apart reduces the atomic forces that interfere with the movement of electrons through the transistors and thus improves carrier mobility, resulting in better chip performance and lower energy consumption. This can be accomplished by putting the layer of silicon over a substrate of, for example, silicon germanium (SiGe), in which the atoms are arranged farther apart than those of a silicon substrate.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

To address the problems previously described, one aspect of the present disclosure provides a semiconductor memory structure. In one embodiment of the present disclosure, the semiconductor memory structure comprises a substrate, a drain stressor having a strained part disposed in the substrate, a source stressor having a strained part disposed in the substrate, and a gate structure disposed in the substrate, between the drain stressor and the source stressor.

In some embodiments, the substrate comprises silicon germanium, and the drain stressor and the source stressor comprise silicon.

In some embodiments, the semiconductor memory structure further comprises a bit line connected to the drain stressor.

In some embodiments, the semiconductor memory structure further comprises a bit line contact disposed between the drain stressor.

In some embodiments, the semiconductor memory structure further comprises a storage capacitor connected to the source stressor.

In some embodiments, the semiconductor memory structure further comprises a storage node contact disposed between the storage capacitor and the source stressor.

In some embodiments, the drain stressor comprises a first drain layer, a second drain layer and a third drain layer, and the source stressor comprises a first source layer, a second source layer, and a third source layer.

In some embodiments, the semiconductor memory structure further comprises gate structure comprises a gate electrode, a gate dielectric layer, and a gate seal.

In some embodiments, the semiconductor memory structure further comprises a shallow trench isolation.

Another aspect of the present disclosure provides a method of manufacturing a semiconductor memory structure. In one embodiment of the present disclosure, the method of manufacturing the semiconductor memory structure comprises the steps of providing a substrate; forming a gate trench in the substrate; forming a gate structure in the gate trench; forming a drain recess and a source recess on the substrate, wherein the gate trench is between the drain recess and the source recess; and forming a drain stressor and a source stressor in the drain recess and the source recess, respectively.

In some embodiments, the step of forming the gate structure comprises the steps of: forming a gate dielectric layer in the gate trench; forming a gate electrode in the gate trench, on the gate dielectric layer; and forming a gate seal on the gate electrode.

In some embodiments, the semiconductor memory structure further comprises the step of forming a gate trench in the substrate comprises selective etching.

T In some embodiments, the semiconductor memory structure further comprises the step of forming a drain stressor and a source stressor comprises: forming a first silicon-containing layer; forming a second silicon-containing layer; and forming a third silicon-containing layer.

In some embodiments, the semiconductor memory structure further comprises the substrate comprises silicon germanium.

In some embodiments, the semiconductor memory structure further comprises the step of forming a drain recess and a source recess comprises selective etching.

In some embodiments, the method further comprises forming a bit line contact on the drain stressor.

In some embodiments, the method further comprises forming a bit line connected to the drain stressor via the bit line contact.

In some embodiments, the method further comprises forming a storage node contact on the source stressor.

In some embodiments, the method further comprises forming a storage capacitor connected to the source stressor via the storage node contact.

In some embodiments, the method further comprises forming a shallow trench isolation in the substrate.

The semiconductor memory structure disclosed in the present disclosure includes a gate structure disposed in a gate trench; that is, the gate is buried in the substrate. The buried gate is completely buried under the surface of the substrate, so that the length of the channel is ensured by carefully designed gate trench dimensions, and the short channel effects can therefore be avoided, which results in a semiconductor device with higher reliability.

Moreover, the drain stressor and the source stressor are employed to increase the interatomic distance of the substrate and therefore create a channel with a strained silicon layer. Thus, the mobility of the carriers in the channel can be significantly improved. This feature combined with the buried gate results in a product with better performance, lower energy consumption and higher reliability.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
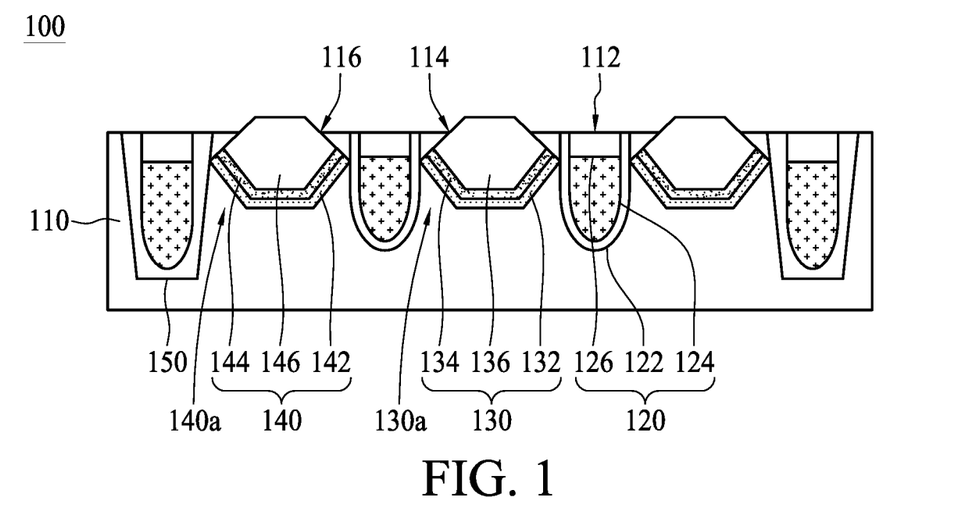
FIG. 1 is a sectional view of a semiconductor memory structure in accordance with some embodiments of the present disclosure.

FIG. 1 is a sectional view of a semiconductor memory structure in accordance with some embodiments of the present disclosure. Please refer to FIG. 1. The semiconductor memory structure 100 provided in the present disclosure includes a substrate 110, a gate structure 120, a drain stressor 130 and a source stressor 140. The gate structure 120 is disposed in the substrate 110. The drain stressor 130 includes a strained part 130a buried in the substrate 110, and the source stressor includes a strained part 140a buried in the substrate 110. In some embodiments, the gate structure 120 is composed of a gate dielectric layer 122, a gate electrode 124, and a gate seal 126. In other embodiments, the drain stressor 130 includes a first drain layer 132, a second drain layer 134, and a third drain layer 136, and the source stressor 140 includes a first source layer 142, a second source layer 144, and a third source layer 146. In some embodiments, the semiconductor memory structure 100 may further include a plurality of shallow trench isolations 190, which define the active region (not shown).

Figure 2:
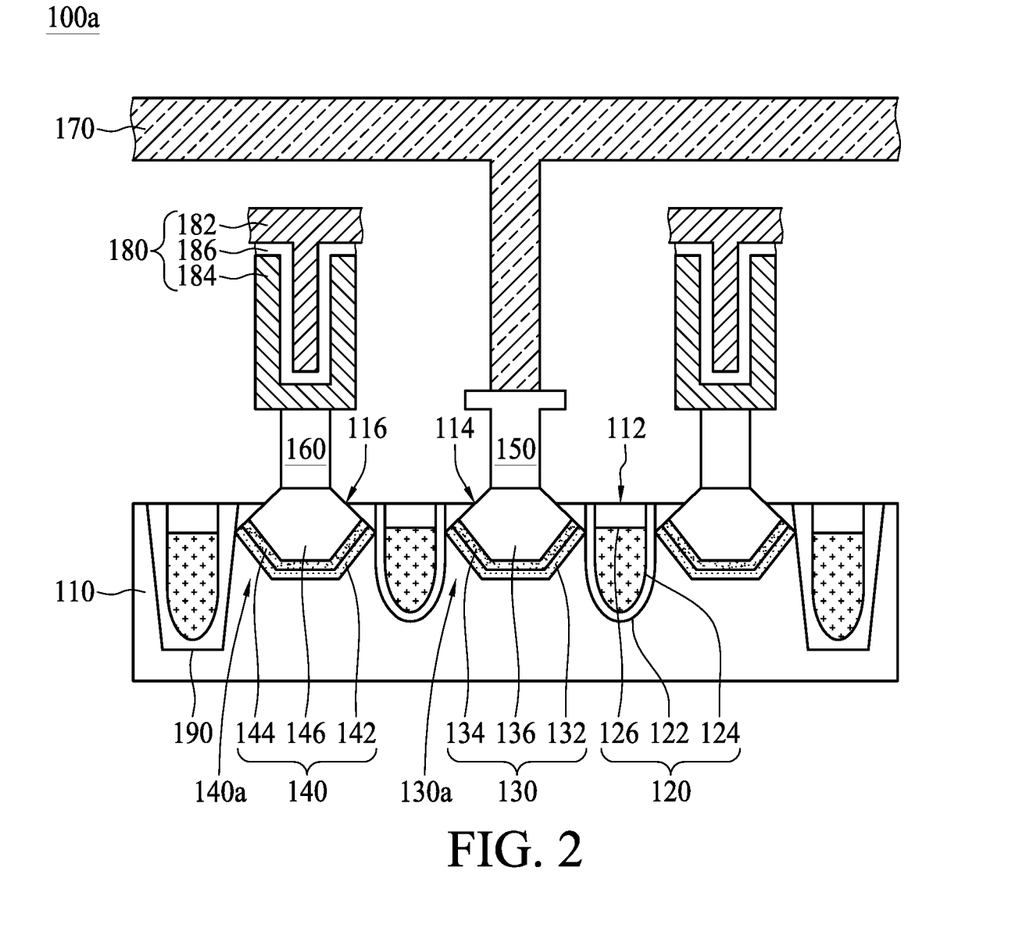
FIG. 2 is a sectional view of a semiconductor memory structure in accordance with some embodiments of the present disclosure.

FIG. 2 is a sectional view of a semiconductor memory structure in accordance with some embodiments of the present disclosure. In some embodiments, the semiconductor memory structure 100a provided by the present disclosure is similar to the semiconductor memory structure 100 disclosed in FIG. 1, but further includes a bit line 170 and a storage capacitor 180, which includes a storage node 184, a cell plate 182 and a dielectric layer 186 between the storage node 184 and the cell plate 182. In some embodiments, the semiconductor memory structure 100a may further include a bit line contact 150 and a storage node contact 160, whereby the bit line 170 is electrically connected to the drain stressor 130 via the bit line contact 150, and the storage node 184 of the storage capacitor 180 is electrically connected to the source stressor 140 via the storage node contact 160. In some embodiments, the gate structure 120 can be connected to a word line (not shown).

In some embodiments, the substrate 110 may be a semiconductor substrate, such as silicon, silicon carbide (SiC), silicon germanium, a III-V compound semiconductor, combinations thereof, or the like. In some embodiments, the material used to form the drain stressor 130 and the source stressor 140 may be silicon, which can be stretched by the SiGe to create a strained silicon layer. In some embodiments, the drain stressor 130 and the source stressor 140 may be hydrogen terminated.

The gate structure 120 is buried in the substrate 110. A buried gate such as the gate structure 120 disclosed in the present disclosure can ensure the length of the channel (not shown) between the drain stressor 130 and the source stressor 140 simply by controlling the depth of the gate trench 112, which can reduce the short channel effect.

Moreover, the drain stressor 130 and the source stressor 140 are formed with materials that can form a strained silicon layer, which has a greater interatomic distance and which can increase the mobility of the carriers and thus improve the performance of the device.

Figure 3:
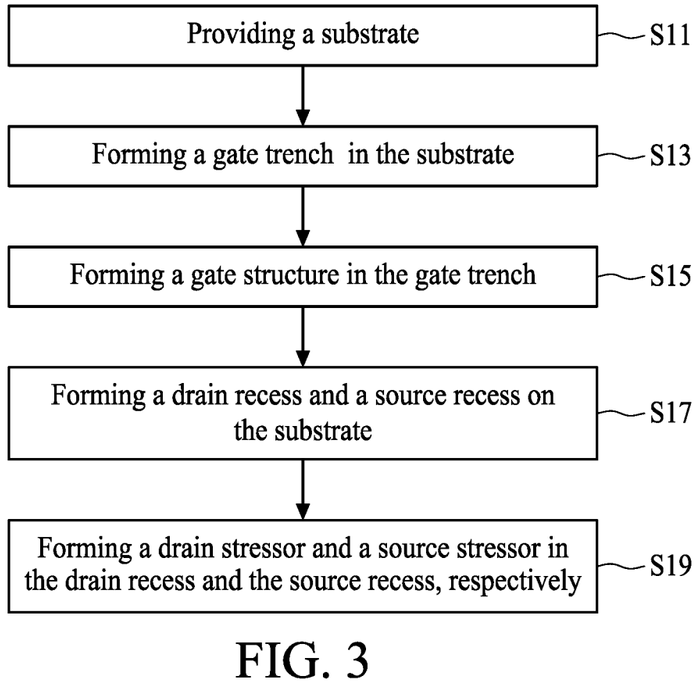
FIG. 3 is a flow diagram of a method of manufacturing a semiconductor memory structure in accordance with some embodiments of the present disclosure.
Figure 4:
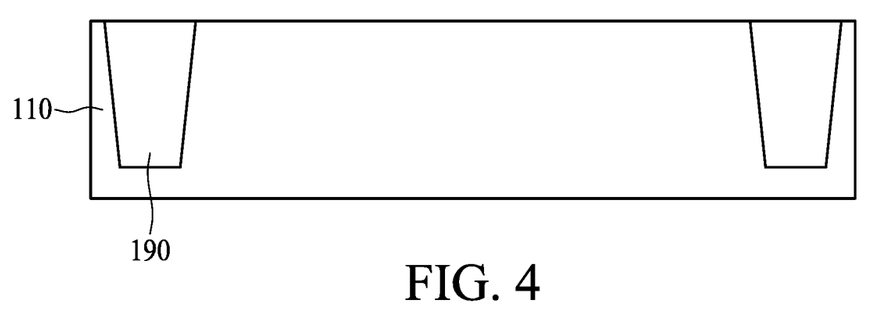
FIG. 4 to FIG. 13 are sectional views of the results of the steps of a method of manufacturing a semiconductor memory structure in accordance with some embodiments of the present disclosure.

The method of manufacturing the semiconductor memory structure 100 will be explained in detail below along with drawings. FIG. 3 is a flow diagram of a method of manufacturing a semiconductor memory structure in accordance with some embodiments of the present disclosure, and FIG. 4 to FIG. 9 are sectional views of the results of steps of the method of manufacturing a semiconductor memory structure in accordance with some embodiments of the present disclosure. Please refer to FIG. 1 and FIGS. 3 to 9. The first step S11 of the method includes providing a substrate 110. In some embodiments, the substrate 110 may be a semiconductor substrate, such as silicon, SiC, SiGe, a III-V compound semiconductor, combinations thereof, or the like. In some embodiments, the substrate 110 may include a shallow trench isolation 190, as shown in FIG. 4. For example, several STI trenches (not shown) may be formed on the substrate 110 and filled to form shallow trench isolations 190. In some embodiments, the STI trenches may be formed by selective etching. Next, to form the shallow trench isolation 190, the step of forming an insulating layer over the substrate 110 and the STI trenches may be performed. In some embodiments, the insulation layer may be formed by a single gap-filling process based on a fluid oxide layer. In some other embodiments, the insulation layer may be configured in the form of a combination (e.g., a stacked form) of the fluid oxide layer and the deposition oxide layer. For example, the fluid oxide layer may include a spin-on dielectric (SOD) and the deposition oxide layer may include a high-density plasma (HDP) oxide layer. The insulation layer is then polished by chemical mechanical polishing (CMP) to remove the insulation layer on the substrate 110. The insulation layer remaining in the STI trenches forms the shallow trench isolation 190 as shown in FIG. 4.

Figure 5:
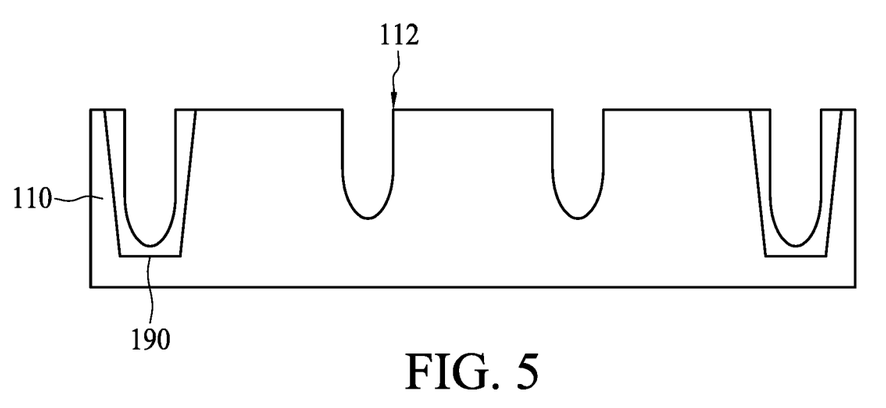

Please refer to FIG. 5. In step S13, a gate trench 112 is formed on the substrate 110. In some embodiments, the substrate 110 is selectively etched to form the gate trench 112. In some embodiments, a hard mask layer (not shown) is formed on the substrate 110 and a photoresist pattern (not shown) for defining the gate area is formed on the hard mask layer. In such case, the hard mask layer may be configured in a stacked form of an amorphous carbon layer (ACL) and a SiON layer, for example. The hard mask layer is then etched using the photoresist pattern as an etch mask, so that a hard mask pattern (not shown) is formed. Subsequently, the photoresist pattern is removed, and the substrate 110 is etched using the hard mask pattern as an etch mask, such that the gate trench 112 is formed on the substrate 110. In some embodiments, the trench may be formed by etching not only the active region of the substrate but also the shallow trench isolation 190. Generally, a gate is configured in the form of a line, so that the active region and the shallow trench isolation 190 are simultaneously etched and a line-type trench is formed. In such case, the active region and the shallow trench isolation 190 have different etch selectivity ratios, so that the shallow trench isolation 190 is etched more deeply than the active region. That is, the active region is configured in the form of a fin gate, such that it protrudes more than the shallow trench isolation 190 in the gate region.

Figure 6:
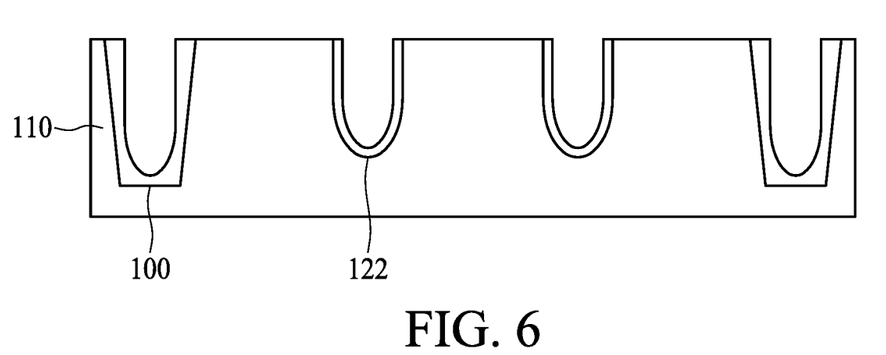
Figure 7:
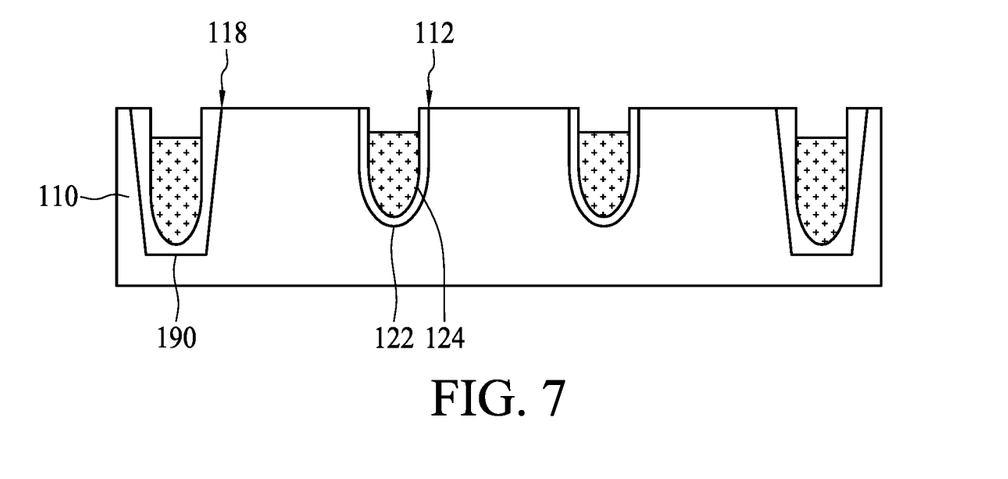

Please refer to FIG. 6. In step S15, the gate structure 120 is formed in the gate trench 112. In some embodiments, the gate structure 120 may include a gate dielectric layer 122, which may be an oxide layer and formed by performing an oxidation process in the gate trench 112 to oxidize the substrate 110 in the gate trench 112, for example. Next, the gate electrode 124 is formed in the gate trench 112, as shown in FIG. 7. In some embodiments, the gate electrode 124 can be formed by depositing a metal layer (not shown) on the substrate 110 and in the gate trench 112, and then processing the metal layer until the metal layer is lower than the surface of the substrate 110 and the remaining metal layer fills only part of the gate trench 112. In such case, the metal layer may, for example, include a titanium nitride (TiN) layer, a tantalum nitride (TaN) layer, a tungsten (W) layer, or the like. In order to reduce resistance of the gate electrode 124, a thin titanium nitride layer (or a tantalum nitride layer) may be conformably deposited, and the tungsten layer may be used for gap filling in such a manner as to form the gate electrode 124 with low resistance.

In some embodiments, the gate electrode 124 may be formed by depositing the titanium nitride layer and the tantalum nitride layer, or may be formed by sequentially depositing the titanium nitride layer, the tantalum nitride layer, and the tungsten layer. The metal layer deposited may then be planarized by CMP or the like. Subsequently, the metal layer is etched back and cleaned in such a manner that the metal layer is buried in only some parts of the trench, so that the gate electrode 124 is formed. In such case, the etch-back process is continuously conducted until the surface of the metal layer in the gate trench 112 becomes lower than the surface of the substrate 110 and the desired height of the gate electrode 124 is obtained.

Figure 8:
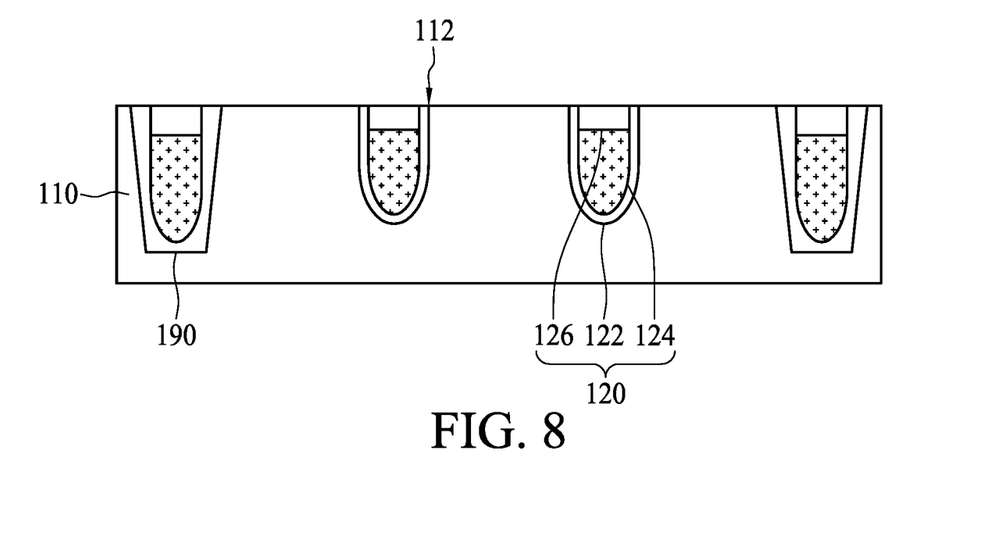

In some embodiments, the gate electrode 124 can then be sealed with a gate seal 126, as shown in FIG. 8. In such case, a sealing layer (not shown), such as a nitride layer, may be formed to seal the upper part of the gate trench 112 and protect the gate electrode 124. In some embodiments, after the sealing layer is sealed in a manner such that the gate trench 112 is completely filled with the nitride layer, the sealing layer is selectively removed by a strip process, so that the sealing layer remains only over the gate electrode 124 and in the gate trench 112.

Figure 9:
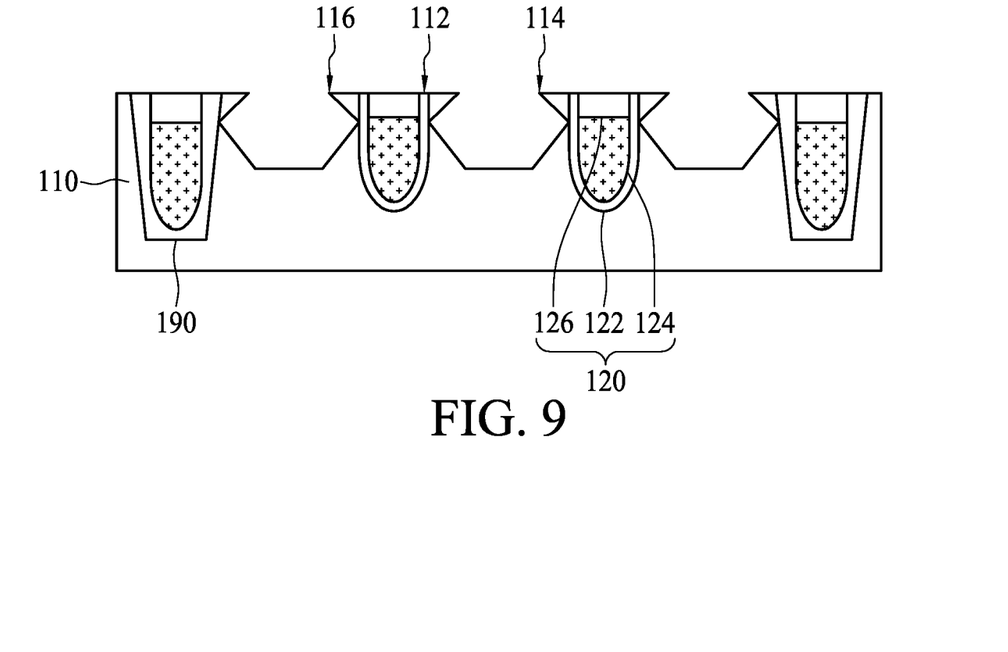
Figure 10:
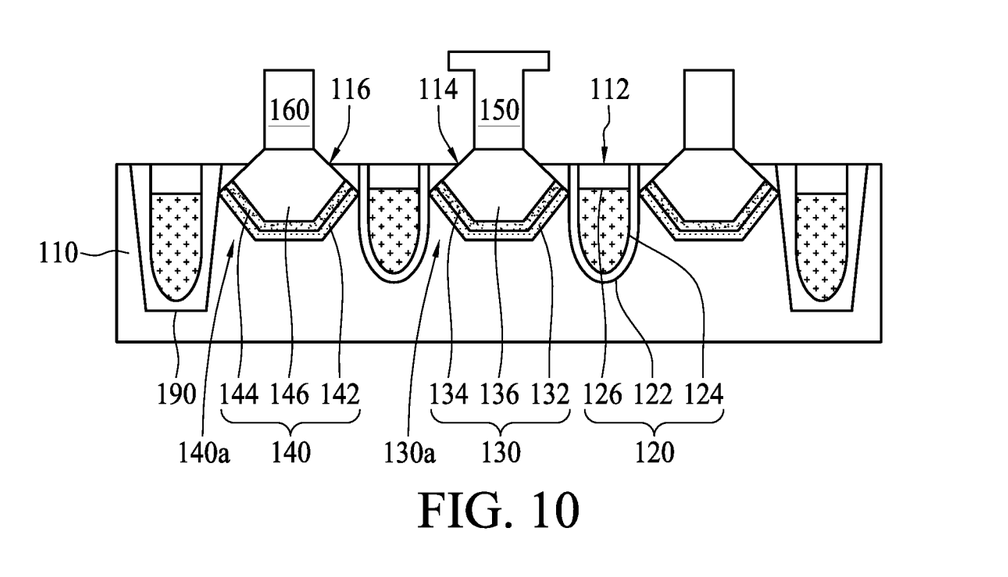
Figure 11:
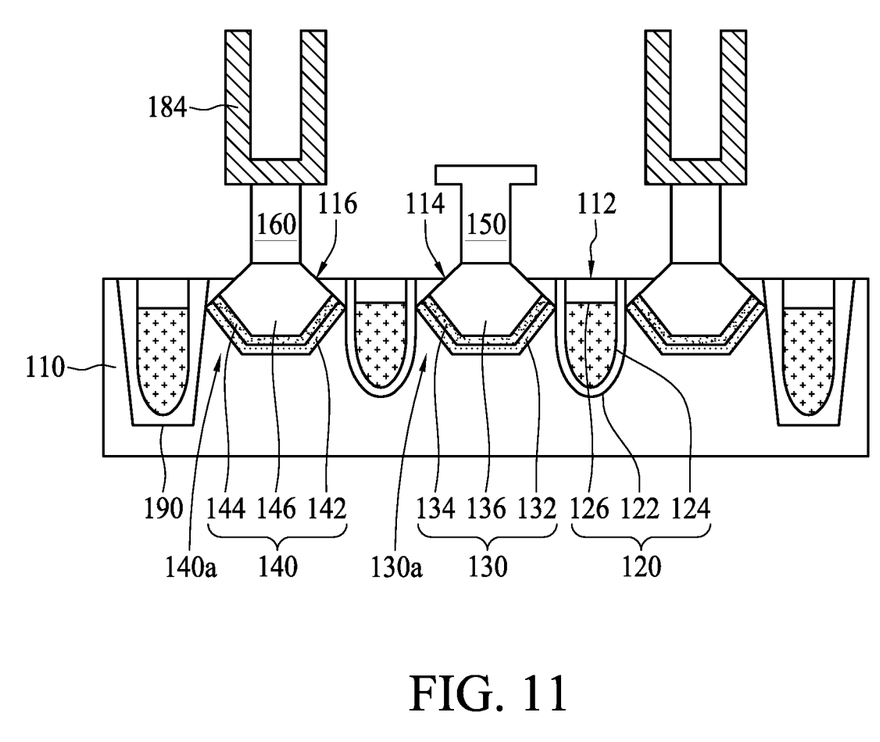

Next, in step S17, the drain recess 114 and the source recess 116 are formed on the substrate 110, as shown in FIG. 9. In some embodiments, a hard mask (not shown) that defines the drain and source areas can be formed by a photolithography process, and the drain recess 114 and the source recess 116 may be formed using, for example, a wet etch process selective to the material of the substrate 110, wherein the wet etch process uses the hard mask to form the drain recess 114 and the source recess 116. For example, an etchant, such as carbon tetrafluoride ($CF_4$), tetramethylammonium hydroxide (THMA), combinations of these, or the like, may be used to perform the wet etch process and to form the drain recess 114 and the source recess 116.

In step S19, the final step, the drain stressor 130 and the source stressor 140 are formed in the drain recess 114 and the source recess 116, respectively. Please refer to FIG. 1. In some embodiments, the drain stressor 130 and the source stressor 140 may be formed by a cyclic deposition and etching (CDE) process. The CDE process includes an epitaxial deposition/partial etch process, which is repeated one or more times. In such case, a first silicon-containing layer (not shown) is epitaxially deposited in the drain recess 114 and the source recess 116. In some embodiments, the resulting metal-oxide-semiconductor (MOS) device is an nMOS device, and the first silicon-containing layer may be made of, for example, silicon, silicon carbide, other semiconductor materials, and/or combinations thereof. The deposition of the first silicon-containing layer may use at least one silicon-containing precursor, such as silane ($SiH_4$), trisilane ($Si_3H_8$), disilane ($Si_2H_6$), dichlorosilane ($SiH_2Cl_2$), other silicon-containing precursors, and/or combinations thereof. In some embodiments, the deposition of the first silicon-containing layer may include in-situ doping of the first silicon-containing layer. When the resulting metal-oxide-semiconductor (MOS) device is an nMOS device, an n-type doping precursor, for example, phosphine ($PH_3$) and/or other n-type doping precursors, may be used.

In some embodiments, the deposition of the first silicon-containing layer may use a carrier gas to introduce the silicon-containing precursor and the n-type doping precursor into the process chamber. The carrier gas may be, for example, nitrogen gas ($N_2$), hydrogen gas ($H_2$), or combinations thereof. In some embodiments, the first silicon-containing layer may be formed by chemical vapor deposition (CVD), for example, atomic-layer CVD (ALCVD), ultra-high vacuum CVD (UHVCVD), low-pressure CVD (LPCVD), reduced-pressure CVD (RPCVD), or other suitable CVDs; molecular beam epitaxy (MBE) process; other suitable epitaxial processes; or combinations thereof. Next, a portion of the first silicon-containing layer in the drain recess 114 and the source recess 116 is removed to form the first drain layer 132 and the first source layer 142. In some embodiments, the removal of the first silicon-containing layer may include use of an etch gas including at least one of hydrogen chloride (HCl), chlorine ($Cl_2$), germanium hydride ($GeH_4$), and other suitable etch gases.

Next, a second silicon-containing layer (not shown) is epitaxially deposited on the remaining first drain layer 132 and the first source layer 142. In some embodiments, the material and the method of forming the second silicon-containing layer are the same as or similar to those of the first silicon-containing layer as described above. In some embodiments, the second silicon-containing layer may have a dopant concentration different from that of the first silicon-containing layer. A portion of the second silicon-containing layer in the drain recess 114 and the source recess 116 is then removed to form the second drain layer 134 and the second source layer 144, which are on the first drain layer 132 and the first source layer 142, respectively. In some embodiments, the removal of the second silicon-containing layer is the same as or similar to the removal of the first silicon-containing layer described above.

Subsequently, a third silicon-containing layer (not shown) is epitaxially deposited to fill the remaining space of the drain recess 114 and the source recess 116 by a selective epitaxial growth (SEG) process. The SEG process is a selective deposition process, and the third silicon-containing layer formed by this process is deposited on the second drain layer 134 and the second source layer 144 to form the third drain layer 136 and the third source layer 146. The third silicon-containing layer deposited by the SEG process may be formed beyond the top surface of the substrate 110, as shown in FIG. 1, in accordance with some embodiments. In alternative embodiments, the top surface of the third silicon-containing layer may be substantially level with the top surface of the substrate 110. In some embodiments, the third silicon-containing layer is doped with phosphorus (P).

In some embodiments, the manufacturing process may continue to form the semiconductor memory structure 100a disclosed in FIG. 2. Please refer to FIG. 10 to 13. In such case, the bit line contact 150 and the storage node contact 160 can be formed on the drain stressor 130 and the source stressor 140, respectively. In some embodiments, forming the bit line contact 150 and the storage node contact 160 may include depositing a conductive layer (not shown), such as a copper layer, on the substrate 110, wherein the conductive layer is in contact with the drain stressor 130 and the source stressor 140. In such case, the conductive layer can then be etched to remove the part of the conductive layer that is not in contact with the drain stressor 130 and the source stressor 140 to form the bit line contact 150 and the storage node contact 160. In some embodiments, a damascene or dual damascene process can be used to form the bit line contact 150 and the storage node contact 160 of more complicated shapes. In some embodiments, the forming of the bit line contact 150 and the storage node contact 160 can be performed in the same step as that in which the conductive layer is formed. In other embodiments, the bit line contact 150 and the storage node contact 160 can be formed separately.

Next, a storage capacitor 180 may be formed in some embodiments to form the semiconductor memory structure 100a shown in FIG. 2. In such case, the storage node 160 may be formed first by forming an inter-layer dielectric (not shown) on the substrate 110. Next, referring to FIG. 11, a storage node contact hole (not shown) is formed on the inter-layer dielectric, wherein the storage node contact hole exposes the storage node contact 160 on the substrate 110. Next, a conductive layer (not shown) is formed on the inter-layer dielectric and fills the storage node contact hole. Subsequently, the conductive layer is patterned by a photolithography process to form the storage node 184.

Figure 12:
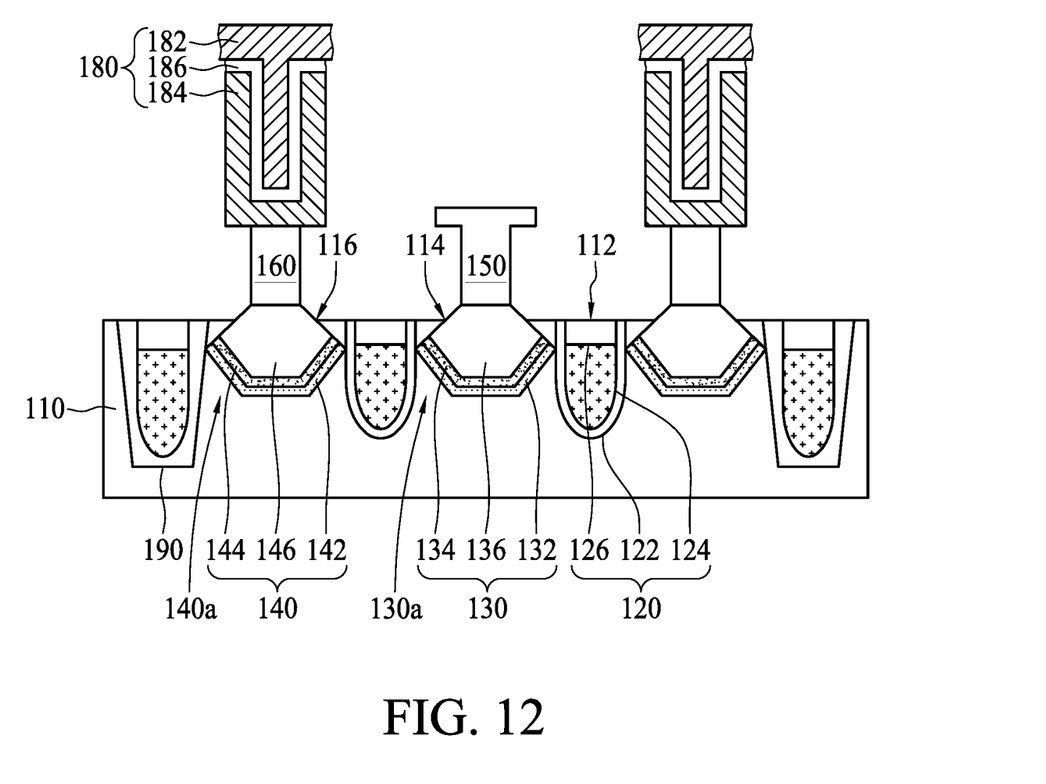

Next, referring to FIG. 12, the dielectric layer 186 can be formed on the storage node 184 using a method such as CVD or oxidation. In some embodiments, the dielectric layer 186 may be a sandwich structure of $SiO_2$— $Si_3N_4$— $SiO_2$. Finally, the cell plate 182 may be formed by forming a polycrystalline silicon layer (not shown) using LPCVD and then performing a photolithography process to define the pattern of the cell plate 182.

Figure 13:
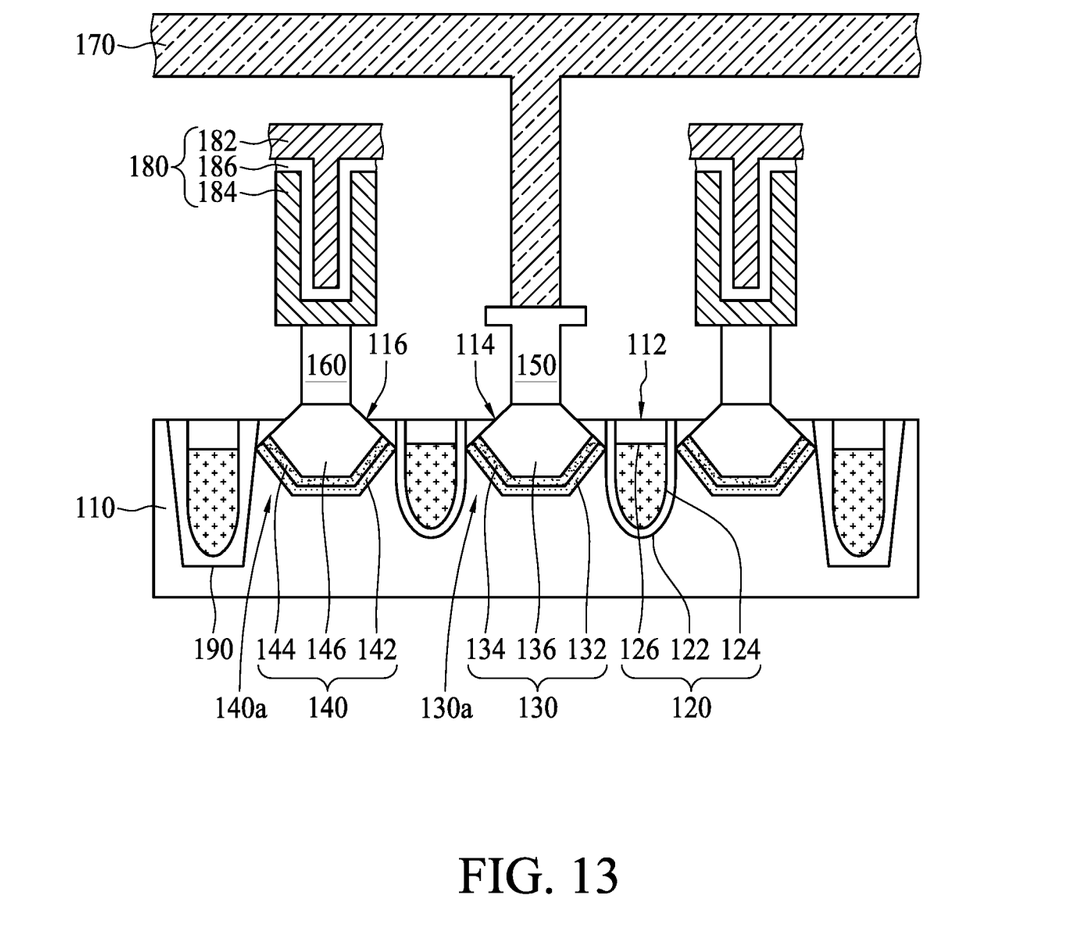

Next, referring to FIG. 13, in some embodiments, a bit line 170 can be formed, wherein the bit line 170 is connected to the bit line contact 150. In some embodiments, the forming of the bit line 170 may include the following steps: forming an inter-layer dielectric (not shown); forming a bit line contact hole (not shown) on the inter-layer dielectric, wherein the bit line contact hole exposes the bit line contact 150 on the substrate 110; forming a conductive layer (not shown) on the inter-layer dielectric and filling the bit line contact hole; and patterning the conductive layer to form the bit line 170.

In summary, the semiconductor memory structures 100, 100a provided in the present disclosure include buried gates and drain/source stressors 130, 140. During the manufacturing of a buried gate, the length of the channel can be ensured by determining the depth of the gate trench 112, which can reduce the short channel effect and results in devices with greater reliability.

Moreover, the semiconductor memory structures 100, 100a provided in the present disclosure also include a drain stressor 130 and a source stressor 140, which create strained silicon layers having greater interatomic distances, thus reducing atomic force interference of the carriers and resulting in carriers with greater mobility and therefore devices with better performance.

In one embodiment, the present disclosure provides a semiconductor memory structure. The semiconductor memory structure includes a substrate, a gate structure, a drain stressor and a source stressor. Each of the source stressor and the drain stressor includes a strained part disposed in the substrate. The gate structure is disposed in the substrate, between the drain stressor and the source stressor.

In another embodiment, the present disclosure provides a method of manufacturing a semiconductor memory structure. The method of manufacturing the semiconductor memory structure begins with providing a substrate. Next, a gate trench is formed on the substrate. The following step is to form a gate structure in the gate trench. In the next step, a drain recess and a source recess are formed on the substrate so that the gate trench is between the drain recess and the source recess. Finally, a drain stressor and a source stressor are formed in the drain recess and the source recess, respectively.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor memory structure, comprising:
    a substrate having a drain recess and a source recess spacedly formed thereon;
    a drain stressor, having a strained part disposed in a bottom of the drain recess to contact the substrate;
    a source stressor, having a strained part disposed in a bottom of the source recess to contact the substrate;
    a gate structure disposed in the substrate, between the drain stressor and the source stressor, a bit line connected to the drain stressor; and
    a gate trench indented on the substrate between the drain recess and the source recess, wherein the gate structure is formed in the gate trench.

2. The semiconductor memory structure of claim 1, wherein the substrate comprises silicon germanium, and the drain stressor and the source stressor comprise silicon, wherein each of the drain recess and the source recess is indented on a top surface of the substrate to form an opening thereon, a flat bottom wall and two non-curved sidewalls extended from the flat bottom wall to the opening.

3. The semiconductor memory structure of claim 1, further comprising a bit line contact disposed between the drain stressor and the bit line.

4. The semiconductor memory structure of claim 1, further comprising a storage capacitor connected to the source stressor.

5. The semiconductor memory structure of claim 4, further comprising a storage node contact disposed between the storage capacitor and the source stressor.

6. The semiconductor memory structure of claim 1, wherein the drain stressor comprises a first drain layer disposed on the bottom of the drain recess, a second drain layer overlaid on the first drain layer and a third drain layer overlaid on the second drain layer, and the source stressor comprises a first source layer disposed on the bottom of the source recess, a second source layer overlaid on the first source layer, and a third source layer overlaid on the second source layer.

7. The semiconductor memory structure of claim 1, further comprising a shallow trench isolation in the substrate.

8. A semiconductor memory structure, comprising:
    a substrate having a drain recess and a source recess spacedly formed thereon;
    a drain stressor, having a strained part disposed in a bottom of the drain recess to contact the substrate;
    a source stressor, having a strained part disposed in a bottom of the source recess to contact the substrate;
    a gate structure disposed in the substrate, between the drain stressor and the source stressor; and
    a gate trench indented on the substrate between the drain recess and the source recess, wherein the gate structure comprises a gate electrode in the gate trench, a gate dielectric layer under the gate electrode, and a gate seal on the gate electrode.

* * * * *